United States Patent
Guerrero Mercado et al.

(10) Patent No.: US 6,731,230 B1
(45) Date of Patent: *May 4, 2004

(54) METHOD TO SMOOTH TRANSITIONS IN AN ADC FOR CURRENT REGULATION

(75) Inventors: Francisco Javier Guerrero Mercado, Landsberg am Lech (DE); Gregory J. Smith, Tucson, AZ (US); Yinming Chen, Tucson, AZ (US); Igor Furlan, San Jose, CA (US)

(73) Assignee: National Semiconductor Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 108 days.

This patent is subject to a terminal disclaimer.

(21) Appl. No.: 10/071,874

(22) Filed: Feb. 8, 2002

(51) Int. Cl.[7] .................. H03M 1/06; H03K 5/153; H03K 5/22; H04L 25/06; H04L 25/10
(52) U.S. Cl. .................. 341/118; 327/72; 375/317
(58) Field of Search .................. 341/118, 120, 341/139; 375/317, 206, 319; 455/234.2; 348/682; 327/72, 58, 62, 166, 97, 103; 324/426; 250/363.02

(56) References Cited

U.S. PATENT DOCUMENTS

| | | | |
|---|---|---|---|
| 3,957,592 A | * 5/1976 | Young | 324/426 |
| 4,024,398 A | * 5/1977 | Hatch | 250/363.02 |
| 4,588,905 A | 5/1986 | Kojima | |
| 4,821,292 A | 4/1989 | Childress | |
| 5,015,878 A | 5/1991 | Lasagna et al. | |
| 5,274,273 A | 12/1993 | Baginski et al. | |
| 5,438,289 A | 8/1995 | Kan et al. | |
| 5,627,860 A | * 5/1997 | McKinny et al. | 375/317 |
| 5,742,899 A | * 4/1998 | Blackburn et al. | 455/234.2 |
| 5,804,997 A | 9/1998 | Nishizono et al. | |
| 5,861,831 A | * 1/1999 | Murden et al. | 341/139 |
| 5,920,589 A | * 7/1999 | Rouquette et al. | 375/206 |
| 5,986,719 A | * 11/1999 | Nakamura | 348/682 |
| 6,512,399 B1 | * 1/2003 | DeGeronimo et al. | 327/62 |
| 6,525,573 B1 | * 2/2003 | Mercado | 327/72 |
| 2001/0010460 A1 | 8/2001 | Miller et al. | |

OTHER PUBLICATIONS

B. Ravavi Introduction to Data Conversion and Processing:, *Data Conversion System Design* IEEE Press ISBN 0–7803–10934, pp. 1–5 p. 9 of NSC 'Application Note 4' from 1991 NSC Linear Applications Handbook.

* cited by examiner

*Primary Examiner*—Patrick Wamsley
(74) *Attorney, Agent, or Firm*—Merchant & Gould P.C.; Timothy P. Sullivan (57) ABSTRACT

The present invention is directed at providing methods in a circuit for smoothing transitions relating to a signal processing function. A reference signal is produced that relates to a DAC output code. The reference signal is used as a starting point, and is compared to the input signal. A feedback signal is produced that is used to adjust the reference. The invention can be used to implement signal processing functions such as peak detection, noise filtering, peak suppression, and the like, in which the transitions in the signal are smoothed. The invention can implement these functions with a minimal complexity and a minimal die area.

15 Claims, 10 Drawing Sheets

METHOD TO SMOOTH TRANSITIONS IN AN ADC FOR CURRENT REGULATION

FIELD OF THE INVENTION

The present invention is related to signal processing, and more specifically to smoothing transitions in an ADC.

BACKGROUND OF THE INVENTION

Generally, signal processing involves the use of a digital signal processor to perform the desired signal processing function. Typically, the following method is used in performing a signal processing function. First, an analog signal is filtered with an anti-alias filter. The analog signal is then converted to a digital signal by means of an ADC (analog to digital converter). Next, a DSP (digital signal processor) is used to perform the desired signal processing function on the digital signal. The digital signal is then converted back to an analog signal by means of a DAC (digital to analog converter). Finally, the signal is filtered with a low pass filter.

The signal processing system described above requires many complex components taking up resources on the circuit. For example, extra power supplies may be needed to provide power to the DSP (digital signal processor), ADC, or other components. Additionally, the available die area on the chip is reduced by each extra component placed on it. For example, the DSP takes up valuable resources on the circuit. Even simple signal processing functions may require many extra components taking up valuable resources.

Many signal processing tracking functions may dither between values, creating a noisy signal. As a result of the noise, unnecessary adjustments within a circuit may be made. What is needed is a way to smooth the transitions and reduce the unwanted noise from the signal processing function.

SUMMARY OF THE INVENTION

The present invention is directed at smoothing transitions in an ADC. The invention is also directed at implementing peak detection with minimal complexity and a minimal die area.

According to one aspect of the invention, a reference signal, is used as a starting point and is adjusted by logic to produce the desired peak detection signal processing function that has smooth transitions. Comparisons are made between the reference signal and an input signal. The reference signal is adjusted to obtain the smoothed peak detection function.

According to another aspect of the invention, algorithms implement a signal processing function based on the history of the last n comparisons between the reference signal and the incoming signal, where n is a pre-determined number greater than zero. The algorithm may also generate feedback that modifies the reference signal.

According to another aspect of the invention, a decision level processing circuit that is arranged to make a comparison between the reference signal and an input signal. The decision level processing circuit is configured to produce a desired signal processing function in response to the comparison.

According to another aspect of the invention, a method for performing peak detection for an incoming signal is provided. The method includes making a comparison between a reference code relating to a code and another signal, applying a peak detection signal processing function to the signal, and producing an output signal in response to the comparison and the peak detection signal processing function.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means a direct electrical connection between the items connected or an indirect connection through one or more passive or active intermediary devices. The term "circuit" means either a single component or a multiplicity of components, either active and/or passive, that are coupled to provide a desired function. The term "signal" means at least one current, voltage, or data signal.

Briefly described, the present invention is directed at a method for smoothing transitions in an ADC for current regulation. A reference signal is used as a starting point and is adjusted to obtain the desired peak detection function. According to one embodiment of the invention, comparisons are made between a reference signal, relating to the output code of a DAC (digital to analog conversion) circuit, and the input signal thereby generating a comparison result signal. A method may then be applied to the comparison result signal to implement the method for smoothing transitions of a signal. The method is also used to help generate a feedback signal that may modify the reference signal.

Figure 1:
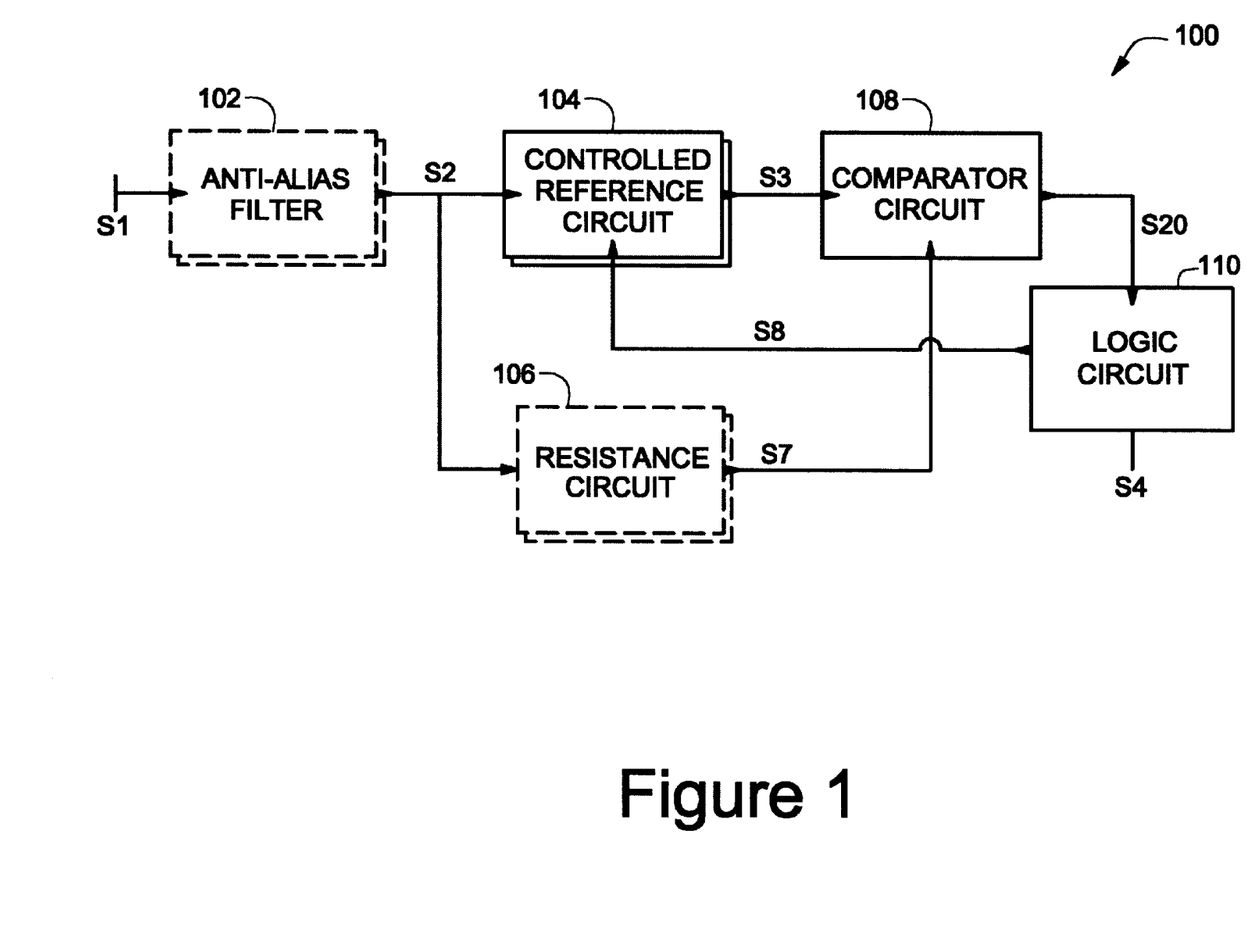
FIG. 1 shows an overview schematic block diagram of a peak detection circuit.

FIG. 1 is an overview schematic block diagram of a circuit that may be used to smooth transitions in an ADC, in accordance with aspects of the invention. As shown in the figure, smoothing circuit 100 includes anti-alias filter 102, controlled reference circuit 104, resistance circuit 106, comparator circuit 108, and logic circuit 110.

Logic circuit 100 is connected as follows. Anti-alias filter 102 includes an input coupled to signal SI, an output coupled that is coupled to an input of controlled reference circuit 104, and an output that is coupled to resistance circuit 106. Controlled reference circuit 104 has an input that is coupled to anti-alias filter 102, an input that is coupled to logic circuit 110, and an output that is coupled to comparator circuit 108. Resistance circuit 106 has an input that is coupled to anti-alias filter 102, and an output that is coupled to comparator circuit 108. Comparator circuit 108 has an input that is coupled to controlled reference circuit 104, an input that is coupled to resistance circuit 106, and an output that is coupled to logic circuit 110. Logic circuit has an input that is coupled to comparator circuit 108, an output that is coupled to controlled reference circuit 104, and another output coupled to signal S4.

Logic circuit 100 operates as follows. Input signal S1 is filtered by anti-alias filter 102 producing signal S2. Controlled reference circuit 104 produces reference signal S3 that relates to signal S2. According to one embodiment of the invention, controlled reference circuit 104 is a DAC. According to an embodiment, controlled reference circuit 104 produces a reference voltage signal that corresponds to a given input signal (S2). Signal S3 is adjusted in response signal S8 output by peak detector logic circuit 110. By directly adjusting the controlled reference circuit output reference signal S3, a signal processing function in which unwanted transitions are smoothed may be applied to input signal S1 without the use of a DSP and ADC.

Resistance circuit 106 produces signal S7 in response to incoming signal S2. Signal S7 directly relates to input signal S2. Comparator circuit 108 compares signal S3, output from controlled reference circuit 104, and signal S7, output by resistance circuit 106. Comparator circuit 108 determines when the reference signal is larger/smaller than the input signal. In response to the comparison between signal S3 output from controlled reference circuit 104, and the input signal S7, comparator circuit 108 produces signal S20 that relates to the comparison. Smoothing logic circuit 110 produces feedback signal S8 that is used to adjust signal S3 produced by controlled reference circuit 104. Logic circuit 110 contains the logic necessary to provide feedback signal S8 used to adjust signal S3 output by controlled reference circuit 104 to perform the smoothing function on the incoming signal. Logic circuit 110 may also contain counters and other components to produce the desired smoothing function. According to one embodiment of the invention, the smoothing is applied to a peak detection signal processing algorithm. Signal S3 is adjusted upward when the input signal moves up and signal S3 is adjusted downward when the input signal moves down.

Circuit 100 has several advantages. The architecture has a very low cost of manufacture, and utilizes a small die area. Additionally, the circuit does not require the use of a digital signal processor to perform the smoothing functions.

Figure 2:
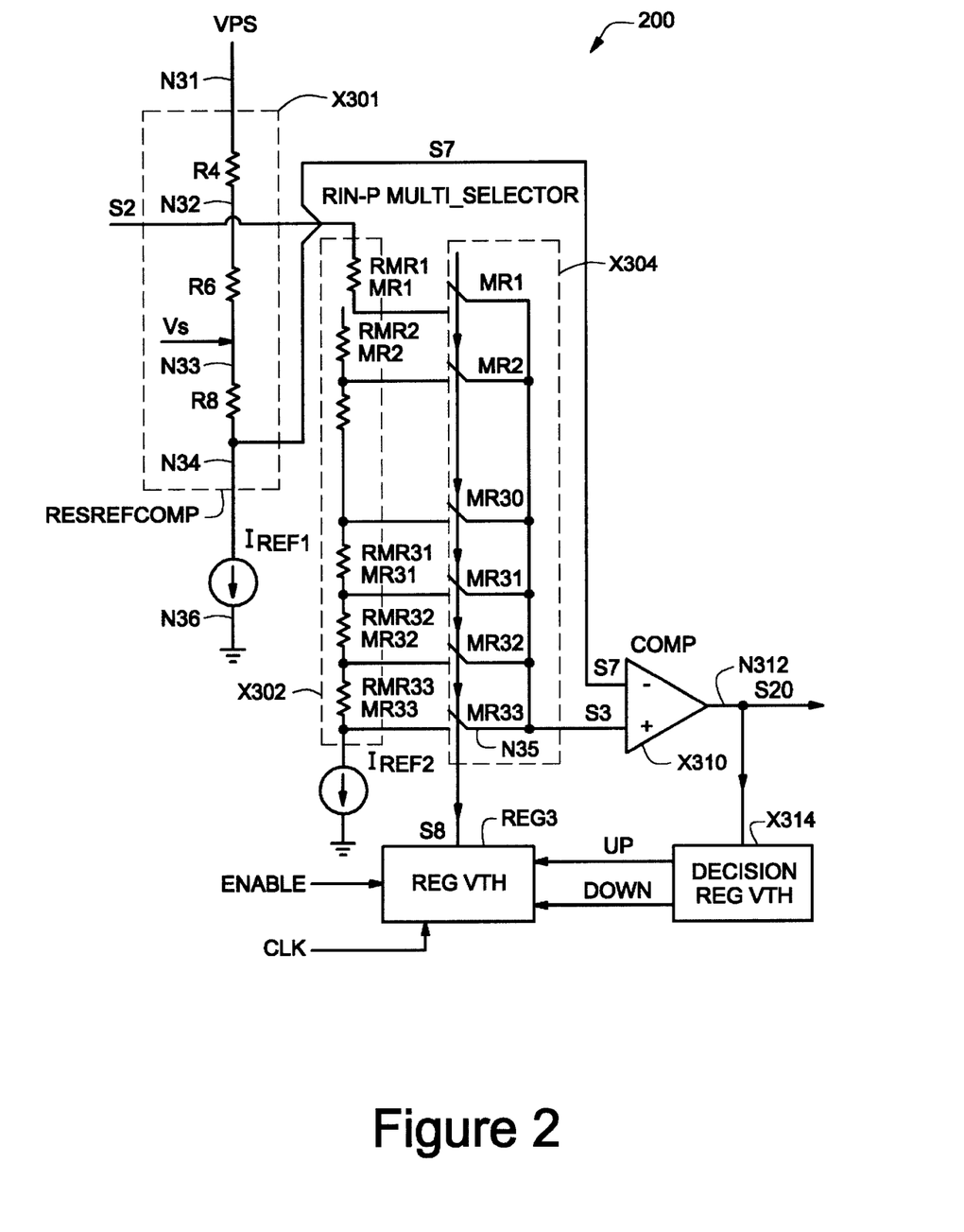
FIG. 2 illustrates a schematic block diagram of an exemplary peak detection circuit.

FIG. 2 is a schematic diagram of a detector circuit, in accordance with aspects of the invention. As shown in the figure, detector circuit 200 includes, resistor array X301 (resistor R4, resistor R6, and resistor R8), current source IRef1, current source IRef2, resistor array X302, multiplexer X304, comparator X310, register Reg3, and decision circuit X314. Multiplexer X304 includes switches MR1 through MR33. Resistor array X302 includes resistors RMR1 through RMR33.

Detector circuit 200 is connected as follows. Resistor R4 is coupled between node N31 and node N32. Resistor R6 is coupled between node N32 and node N33. Resistor R8 is coupled between node N33 and node N34. Current source IRef1 is coupled between node N34 and node N36. Node N36 is coupled to a reference voltage (gnd). Resistor RMR1 is coupled between node N32 and node NMR1. Switch MR1 is coupled between node NMR1 and node N35, and has a switch control coupled to an input to register reg3. Resistor RMR2 is coupled between node NMR1 and node NMR2. Switch MR2 is coupled between node NMR2 and node N35, and has a switch control coupled to the input to register reg3. Resistor MR3 is coupled between node NRM2 and node NMR3. Switch MR3 is coupled between node NMR3 and node N35, and has a switch control coupled to the input to register reg3. These connections continue until resistor RMR33 is coupled between NMR32 and node NMR33, and switch MR33 is coupled between node NMR33 and node N35, and has a switch control coupled to the input to register reg3. Current source IRef2 is coupled between node NMR33 and a reference voltage (gnd). Comparator X310 has a non-inverting input (+) coupled to node N35, an inverting input (−) coupled to node N34, and an output coupled to node N312. Peak detection decision circuit X314 has an input coupled to node N312, an output coupled to register Reg3, and another output coupled to register Reg3.

Detector circuit 200 operates as follows. Detector circuit 200 is directed at peak detection for voltage VPS and smoothing the transitions relating to the peak detection (See FIGS. 4A and 4B and related discussion).

The specific operation of detector circuit 200 will now be described. Resistor array X302, current source IRef2, and multiplexer X304 act together as a controlled reference circuit (in this particular case a DAC), producing reference signal S3 in response to incoming signal S2. Resistor array X301 provides a VPS voltage representation signal (S7). Resistor array X302 provides a reference voltage relating to the input signal S2. The switches (MR1–MR33) actuate in response to signal S8. Signal S8 has a corresponding VPS voltage (VS8rep). In response to the switches actuating, the signal S3 at node N35 increases or decreases. According to one embodiment of the invention, current source Iref1 is created by a shunt circuit that sets the voltage at node N33 to a known voltage. Other reference voltages may be implemented and used.

Comparator X310 compares signal S3 to signal S7 producing comparison result signal S20 at node N312. Signal S20 has a voltage corresponding to a logical level of "low" when the voltage of signal S7 is greater than the voltage of signal S3. Correspondingly, signal S20 has a voltage corresponding to a logical level of "high" when the voltage of signal S7 is less than the voltage of signal S3. Signal S8 is produced by register Reg3 in response to comparison result signal S20, signal S3, clock signal CLK, and control signal ENABLE. Decision circuit X314 receives comparison result signal S20 and determines when signal S3 should increase and when it should decrease, and the result is stored in register reg3. According to one embodiment of the invention, signal S3 increases when the voltage of S3 is lower than the voltage of S7 and, correspondingly, signal S3 decreases when the voltage of S3 is higher than the voltage of signal S7.

According to one embodiment of the invention, detector circuit 200 is used in a battery charging circuit.

Figure 3A:
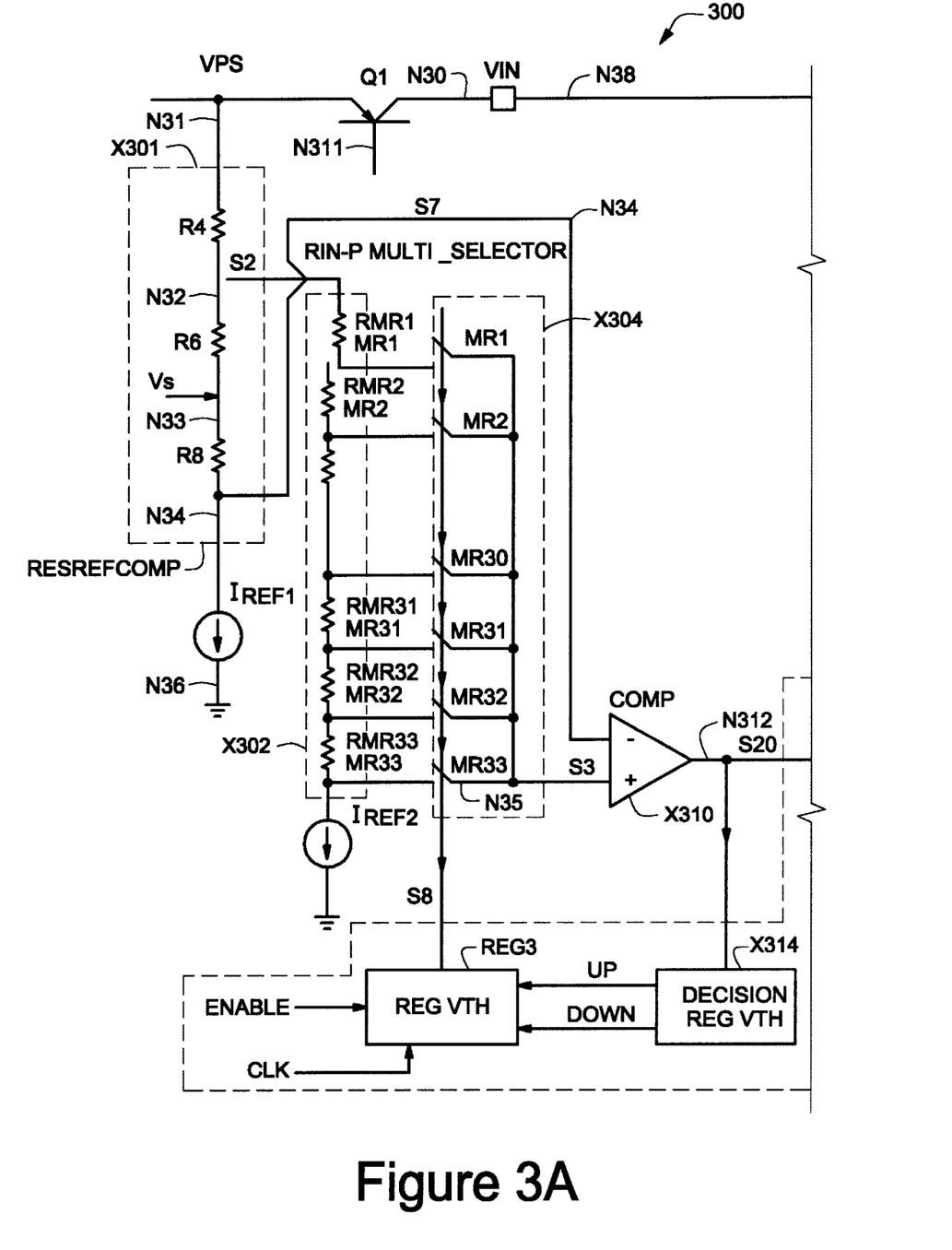
FIGS. 3A and 3B show a schematic block diagram of the peak detection circuit utilized within a battery charging circuit.
Figure 3B:
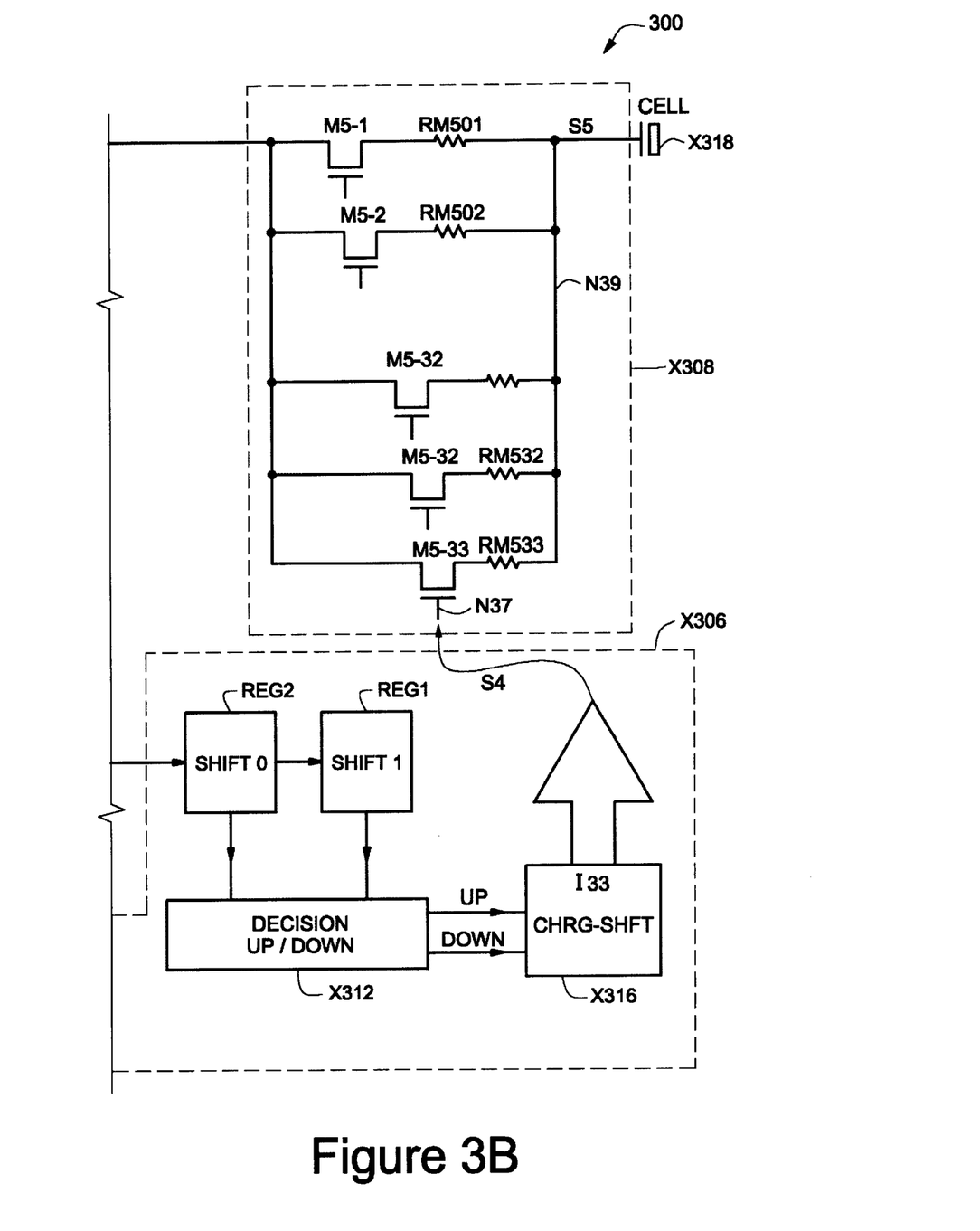

FIGS. 3A–3B are schematic block diagrams of the detector circuit illustrated in FIG. 2 incorporated into a battery charging circuit, in accordance with aspects of the invention. As shown in the figure, battery charging circuit 300 includes the following additional components as shown in FIG. 2. The components include transistor Q1, decision logic circuit X306, transistor array X308, cell X318, and input VIN. Transistor array X308 includes transistors M5-1 through M5-33 and resistors RM501 through RM533. Decision logic circuit X306 includes register Reg1, register Reg2, register Reg3, decision up/down circuit X312, decision circuit X314, and charger shifting circuit X316.

Battery charging circuit 300 is connected as follows. Transistor Q1 has a collector coupled to node N30, an emitter coupled to node N31, and a base coupled to node N311. Input VIN is coupled between node N30 and node N38. Resistor R4 is coupled between node N31 and node N32. Resistor R6 is coupled between node N32 and node N33. Resistor R8 is coupled between node N33 and node N34. Current source IRef1 is coupled between node N34 and node N36. Node N36 is coupled to a reference voltage (gnd). Resistor RMR1 is coupled between node N32 and node NMR1. Switch MR1 is coupled between node NMR1 and node N35, and has a switch control coupled to an input to register reg3. Resistor RMR2 is coupled between node NMR1 and node NMR2. Switch MR2 is coupled between node NMR2 and node N35, and has a switch control coupled to the input to register reg3. Resistor MR3 is coupled between node NRM2 and node NMR3. Switch MR3 is coupled between node NMR3 and node N35, and has a switch control coupled to the input to register reg3. These connections continue until resistor RMR33 is coupled between NMR32 and node NMR33, and switch MR33 is coupled between node NMR33 and node N35, and has a switch control coupled to the input to register reg3. Current source IRef2 is coupled between node NMR33 and a reference voltage (gnd). Comparator X310 has a non-inverting input (+) coupled to node N35, an inverting input (−) coupled to node N34, and an output coupled to node N312. Decision circuit X314 has an input coupled to node N312, an output coupled to register Reg3, and another output coupled to register Reg3. Register Reg2 has an input coupled to node N312, an output coupled to register Reg1, and another output coupled to decision up/down circuit X312. Register Reg1 has an input coupled to register Reg2, and an output coupled to decision up/down circuit X312. Decision up/down circuit X312 has an input coupled to register Reg1, an input coupled to register Reg2, an output coupled to a first input of charger-shifting logic circuit X316, and an output coupled a second input of charge-shifting circuit X316. Charger shifting circuit X316 has two inputs coupled to decision up/down circuit X312, and a logic output coupled transistor array X308. Each of the transistors M5-1 through M5-33 has a gate coupled to charge shifting circuit X316, a source coupled to node N38, and a drain coupled to its respective resistor RM501 through RM533. Each resistor RM501 through RM533 is coupled between the source of its respective transistor M5-1 through M5-33 and node N39. Cell X318 is coupled to node N39.

Figure 4A:
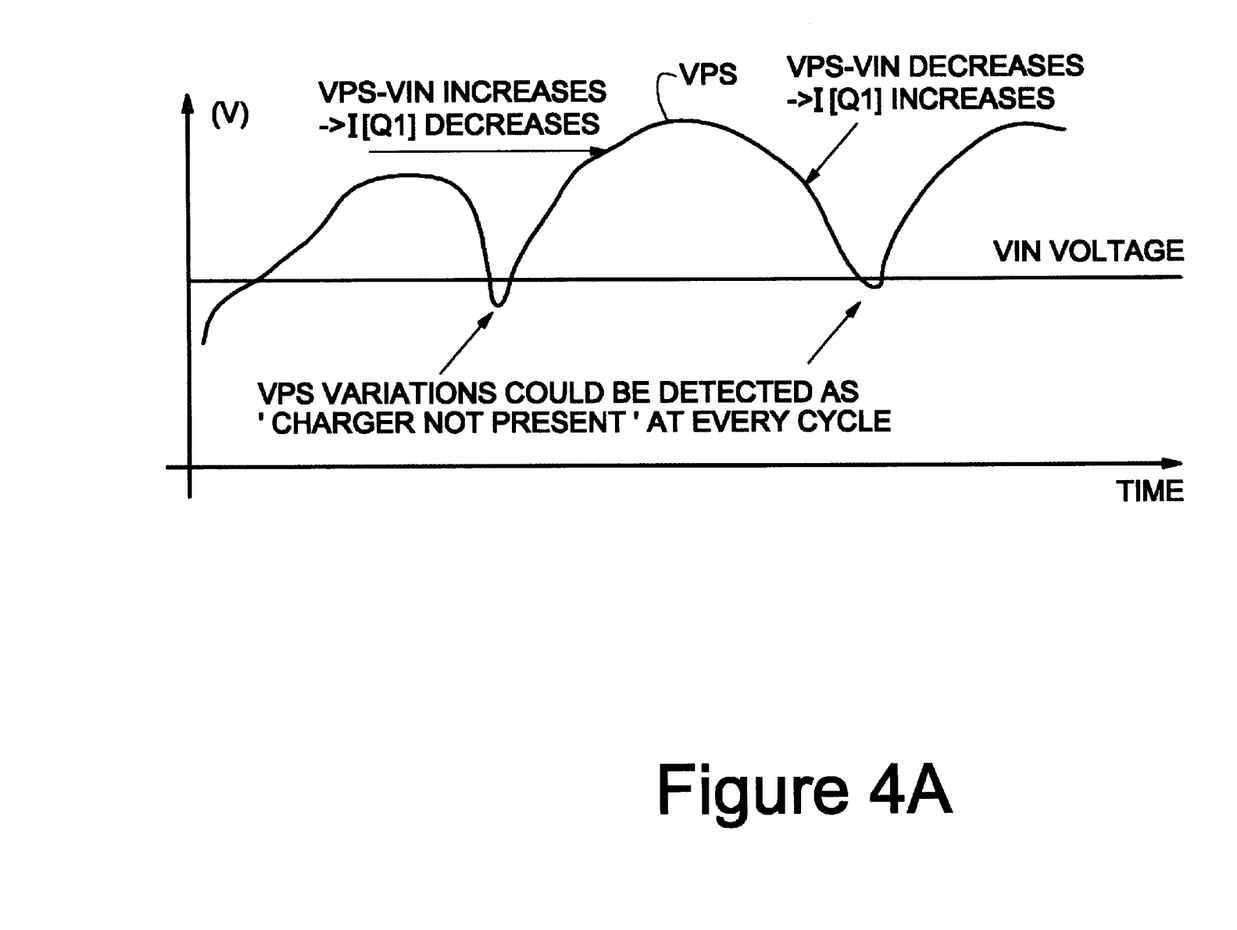
FIG. 4A illustrates an exemplary graph of VPS over time without a peak detector function.
Figure 4B:
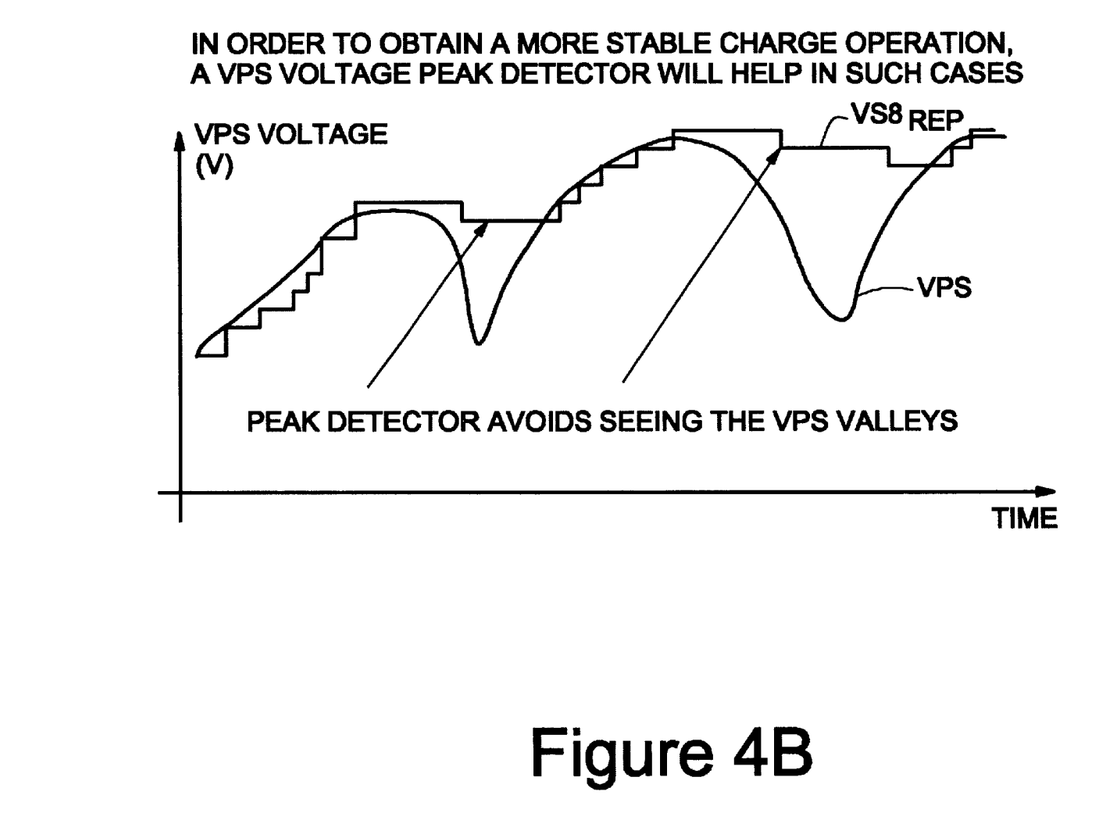
FIG. 4B illustrates an exemplary graph of a peak detector function applied to VPS over time.

Battery charging circuit 300 is directed at detecting peaks in voltage VPS and smoothing the transitions relating to the signal (See FIGS. 4A and 4B and related discussion). According to one embodiment of the invention, battery charging circuit 300 is configured to respond with a fast attack rate and a slow decay rate. In other words, battery charging circuit 300 responds smoothly and quickly to increases in voltage and smoothly and slowly to decreases in voltage.

The operation of the additional components illustrated in FIGS. 3A and 3B will now be described. Samples of comparison result signal S20 are stored in registers Reg1 and Reg2. A first result from comparison result signal S20 is stored in register Reg1, and a second result from comparison signal S20 is stored in register Reg2. According to one embodiment of the invention, only one register is used. According to this particular embodiment, the input is sampled directly by the decision logic. Decision up/down circuit X312 utilizes an attack counter and delay counter to aid in determining when signal S4 should increase, decrease, or remain the same. Using an algorithm based upon the two comparator results stored in Reg1 and Reg2, the logic in decision up/down circuit X312 determines when the decay counter should be increased, decreased, or reset, and determines when the attack counter should be increased, decreased, or reset. Incrementing and decrementing the attack counter and decay counter affects how quickly the detector reacts to changes in VPS. Generally, decision logic circuit X312 implements a fast attack and slow decay. Using the fast attack allows the peak detector to quickly react to the peaks of VPS. Using the slow decay allows the peak detector to slowly react to a diminishing VPS (See FIG. 4B for an exemplary graph). Additionally, the peak detector will not dither between two values, thereby smoothing the output of the circuit. Based on the values of the attack counter and decay counter, decision circuit X312 makes a determination as to whether signal S4 should increase, decrease, or remain the same.

Charger shifting circuit X316 includes drivers that produce a signal S4 to control transistor array X308. Transistor array X308 acts as a DAC (digital/analog converter). Charger shifting circuit X316 adjusts signal S4 according to the input that it receives from decision logic circuit X312. Signal S4 is converted into signal S5 by transistor array X308 and is propagates to cell X318.

The addition of detector circuit 200 to a battery charging circuit allows a smoother operation of the battery charger with a low cost and a small die area. The use of the peak detector avoids seeing the temporary VPS variations that could be detected as a "charger not present" signal thereby affecting the charging of cell X318.

FIG. 4A illustrates an exemplary graph of VPS and VIN over time. As shown in figure, the graph shows voltage VPS periodically dropping below the VIN voltage. Each time VPS drops below VIN, a "charger not present" signal could be detected by the battery charging circuit thereby adversely affecting the charging of the battery.

FIG. 4B illustrates an exemplary graph of a peak detector signal processing function applied to VPS over time, in accordance with aspects of the invention. As shown in the figure, the graph illustrates voltage VPS and signal VS8rep over time. Signal VS8rep is the corresponding VPS voltage defined for a given S8 code. As can be seen, signal VS8rep does not drop below the VIN voltage thereby avoiding any "charger not present" signals. According to one embodiment of the invention, when VPS increases for two consecutive clock cycles, signal VS8rep increases. The peak detector signal illustrated in FIG. 4B is produced by the peak detector circuit illustrated in FIG. 3. The peak detector used in the battery charging circuit has a fast attack and a slow decay. In other words, signal VS8rep increases rapidly in response to increases in voltage VPS and signal VS8rep decreases slowly in response to decreases in voltage VPS. According to one embodiment, signal VS8rep decreases when voltage VPS decreases for 255 consecutive clock cycles. This results in a slow decay, so that signal VS8rep decreases slowly when voltage VPS decreases. The slow decay prevents erratic behavior of the overall circuit. If decay were too fast, valleys in the VPS voltage might be detected as "charger not present," as shown in FIG. 4A. The attack counter and decay counter may be adjusted to change the characteristics of signal VS8rep.

Figure 5:
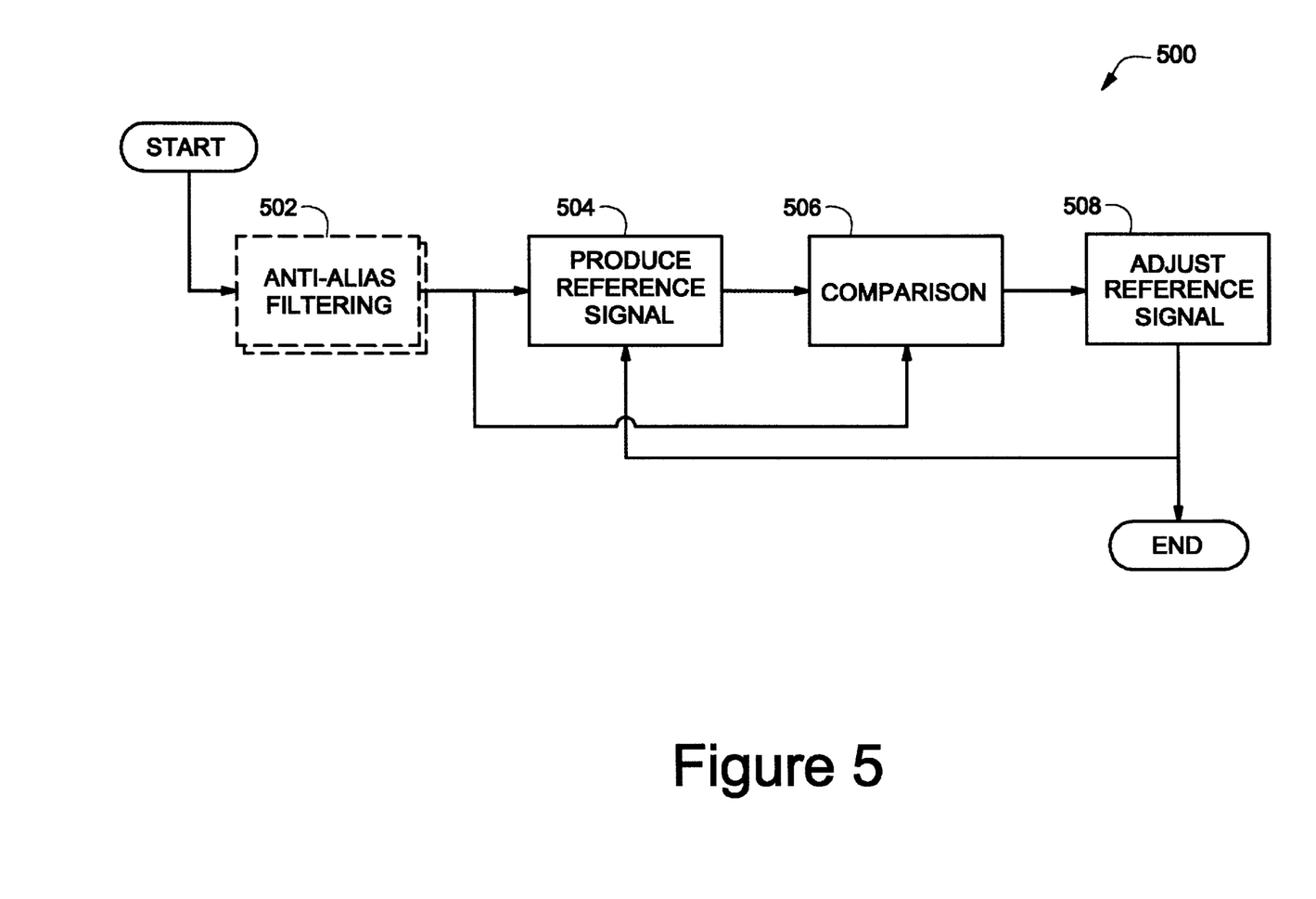
FIG. 5 shows a flow chart for a peak detection signal processing circuit.

FIG. 5 shows a flow chart for an exemplary peak detection signal processing circuit, according to one embodiment of the invention. The method for signal processing architecture 500 includes blocks 502, 504, 506, and 508.

The flow for signal processing architecture 500 proceeds as follows. After a start block, the logic moves to block 502. At block 502, a signal is filtered with an anti-alias filter producing a filtered signal. The logic then moves to block 504, at which point the filtered signal is converted into a reference signal. According to one embodiment of the invention, the reference signal relates to a DAC output code. The reference signal itself is adjusted to obtain the desired peak detection signal processing function. The reference signal may be adjusted for feedback generated in response to the peak detection algorithm implemented at block 508. Stepping to block 506, a comparison is made between the incoming signal and the reference signal. Moving to block 508, the reference signal may be adjusted to perform a peak detection function on the incoming signal. The logic then steps to an end block and terminates.

Figure 6:
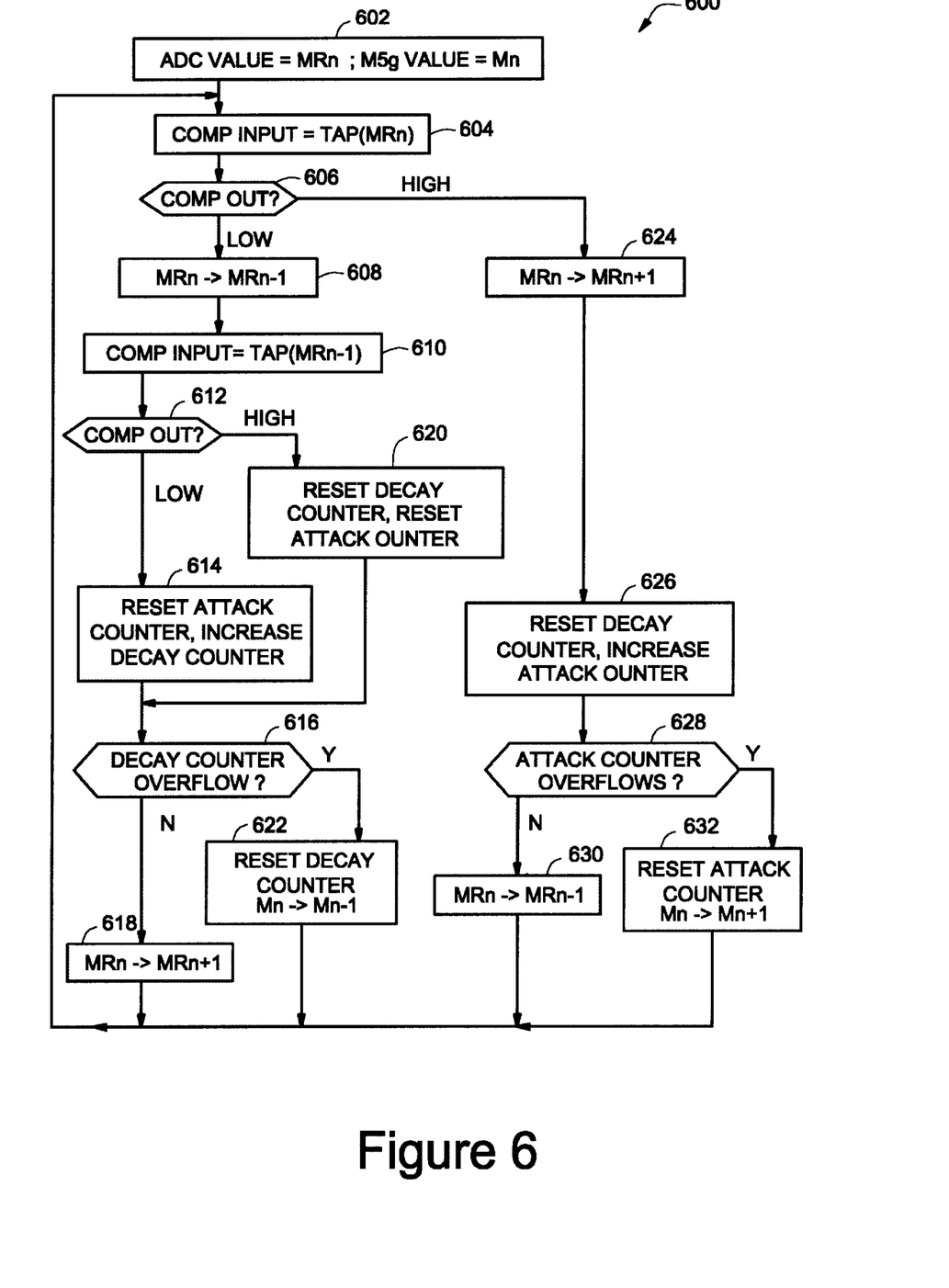
FIG. 6 illustrates a flow chart implementing a method of peak detection with smooth transitions.

FIG. 6 illustrates a flow chart implementing an exemplary method of peak detection with smooth transitions, in accordance with aspects of the invention. Other algorithms may be implemented using the signal processing architecture described (See FIGURES and related discussion below). For example, single comparison algorithms may be implemented.

After a start block, the logical flow moves to block 602. At block 602, the multiplexer node is set by the analog/digital conversion of the analog signal. Transitioning to block 604, the method determines the logical value of the comparison between the reference signal relating to the output code and the input signal itself. Moving to block 606, the method determines whether the logical value of the comparison between the signals is high or low. When the logical value of the comparison between the reference signal and the input signal is low, the logic moves to block 608. At block 608, the process decrements the multiplexer counter. Stepping to block 610, another comparison is made between the signals. At the second comparison, the output code signal has been reduced by one least significant bit. Moving to decision block 612, the process determines whether the second comparison is high or low. When the logical value of the second comparison between the signals is low, the logic moves to block 614. At block 614, the process resets the attack counter and increases the decay counter. Next, at decision block 616, the process determines whether the decay counter has overflowed. When the decay counter has not overflowed the process moves to block 618 at which point the process increments the multiplexer counter. When the decay counter overflows, the logic moves to block 622. At block 622, the process resets the decay counter and decrements the address counter. The logic then returns to block 604.

When the second comparison between the signals is high, the logic moves to block 620. At block 620, the process resets the decay counter and the attack counter. The logical flow then moves to moves to block 618.

When the logical value of the first comparison between the reference signal relating to the output code and the input signal is high, the logic moves to block 624. At block 624, the process increments the multiplexer counter. Moving to block 626, the decay counter is reset and the attack counter is incremented. Transitioning to decision block 628, the method determines whether the attack counter has overflowed. When the attack counter has overflowed, the logic moves to block 632, at which point the attack counter is reset, and the address counter is incremented. When the attack counter has not overflowed, the logic moves to block 630, at which point the multiplexer counter is decremented. The logic then returns to block 604 and repeats itself.

Figure 7:
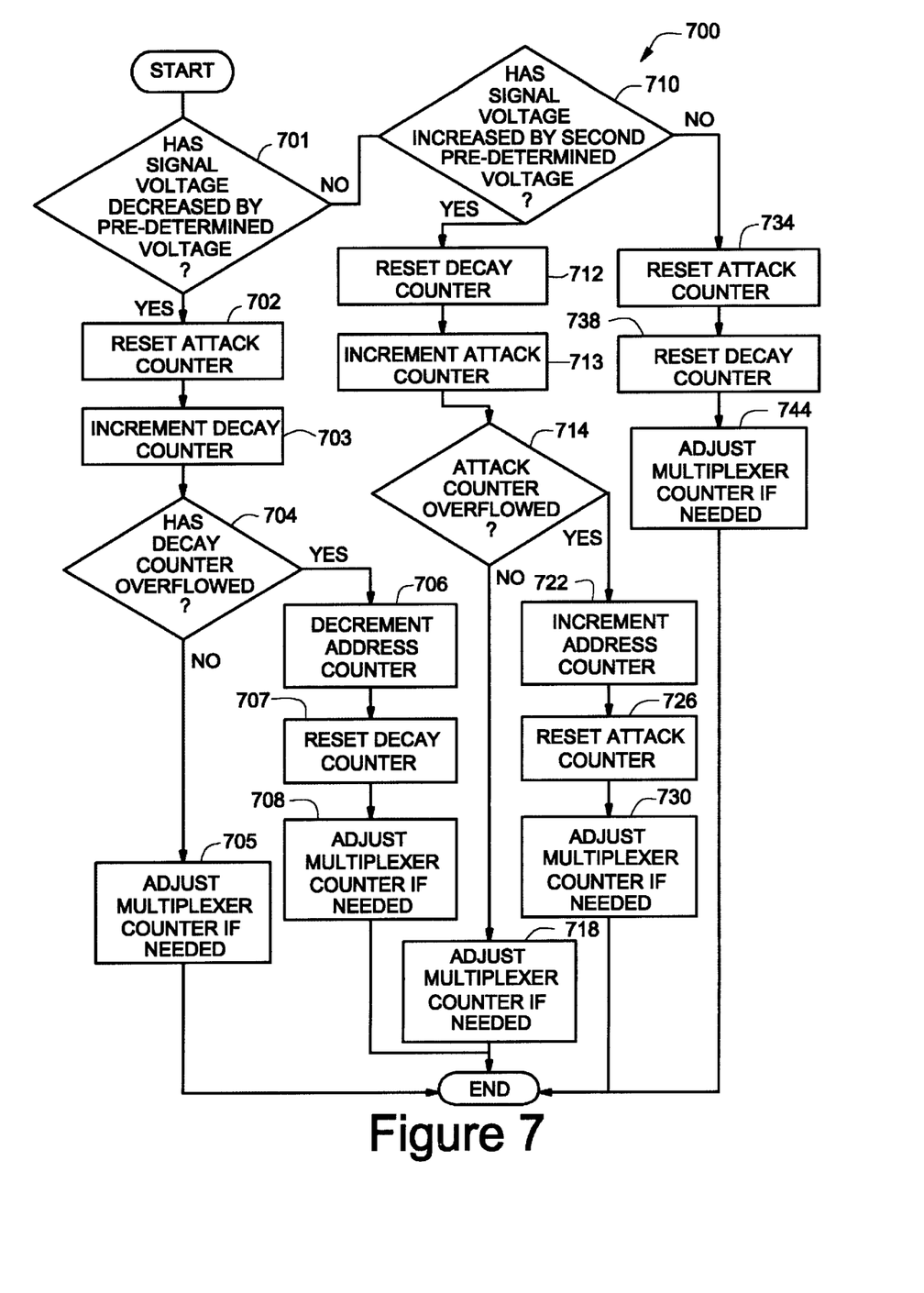
FIG. 7 illustrates a flowchart for smoothing transitions for a peak detection function.

FIG. 7 illustrates a flowchart for smoothing transitions for a peak detection function, according to one embodiment of the invention. After a start block, the logic moves to decision block 701, at which point the logic determines whether a voltage of a signal has decreased by more than a pre-determined voltage. The pre-determined voltage may be zero. When the signal voltage has not increased by more than the pre-determined voltage, then the logic moves to block 710. When the signal voltage has decreased by more than the pre-determined voltage, the logic moves to block 702, where an attack counter is reset. Transitioning to block 703, a decay counter is incremented. The logic then moves to decision block 704, at which point the method determines whether the decay counter has overflowed. When the attack counter has not overflowed, the logic moves to block 705, where the multiplexer counter is adjusted if the multiplexer counter was previously adjusted at block 701. If the multiplexer counter was adjusted at block 701, then the multiplexer counter will be changed to what it was previous to the determination at block 701. The logic then steps to an end block and terminates. When the attack counter has overflowed, the logic moves to block 706.

At block 706, where the address counter is decremented. The logic then moves to block 707 where the decay counter is reset. Flowing to block 708, the multiplexer counter is decremented, unless the multiplexer counter was previously decremented at block 701. The logic then steps to an end block and terminates.

Returning to the no path for decision block 701, when the signal has not decreased by a pre-determined voltage the logic moves to decision block 710, where the method determines whether the signal voltage has increased by more than a second pre-determined voltage. The second pre-determined voltage may be zero. When the signal has increased by more than the second pre-determined voltage, the logic moves to block 712, at which point the decay counter is reset. Transitioning to block 713, the attack counter is incremented. Moving to decision block 714, the method determines whether the attack counter has overflowed. When the attack counter has not overflowed, the logic moves to block 718 where the multiplexer counter is adjusted to the value it was at the beginning of block 701. The logic then steps to an end block and terminates. When the attack counter has overflowed, the logic moves to block 722. At block 722, the address counter is incremented. The logic then moves to block 726, where the attack counter is reset. Transitioning to block 730, the multiplexer counter is incremented, unless it was already incremented at block 710. The logic then ends.

Returning to the no path for decision block 710, when the signal voltage has not increased by more than the second pre-determined voltage, the logic moves to block 734 where the attack counter is reset. Moving to block 738, the decay counter is reset. Transitioning to block 744, the multiplexer counter is adjusted to the value it was at the beginning of block 710 if the multiplexer counter was changed at block 701 or block 710. The logic then steps to an end block and terminates.

Figure 8:
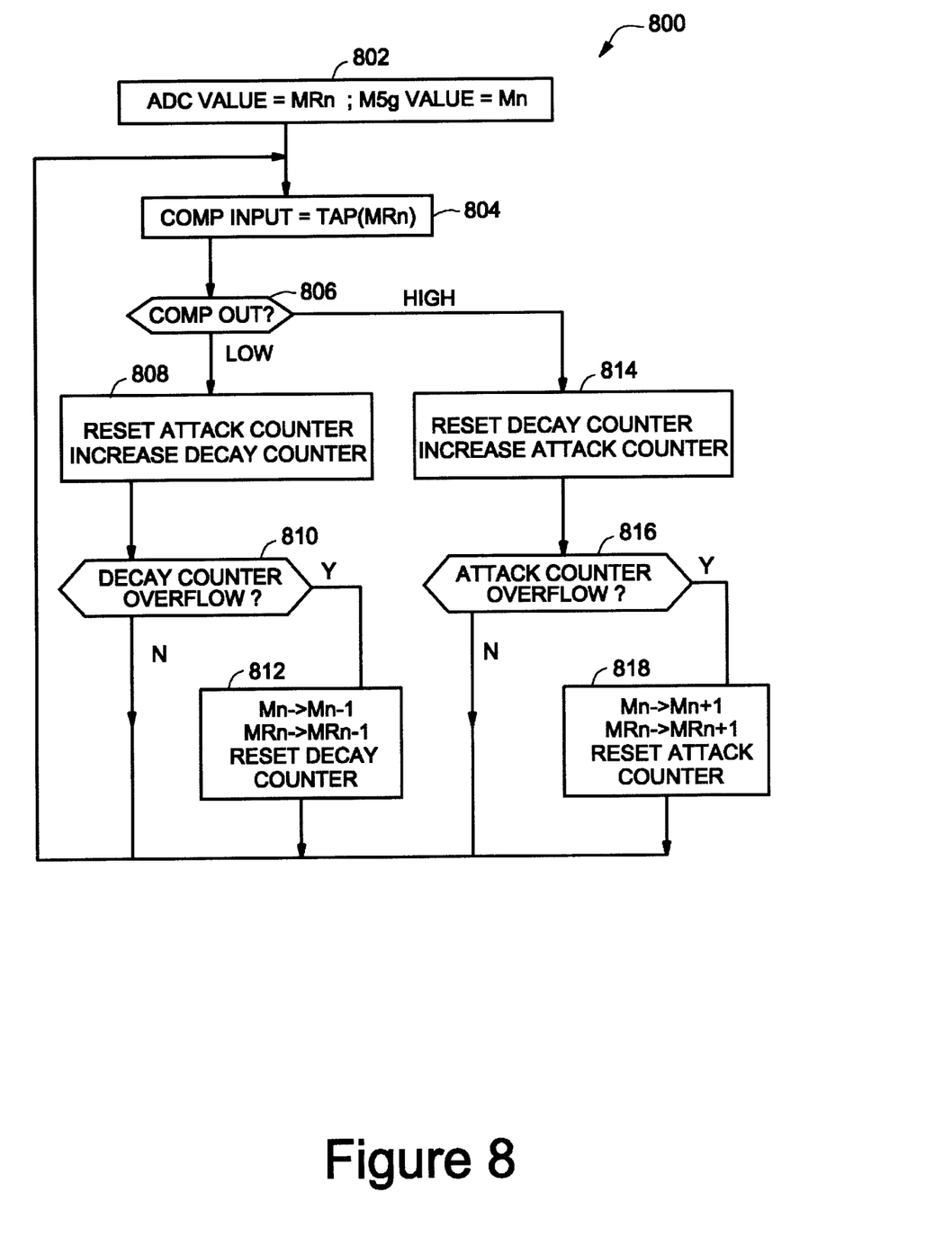
FIG. 8 is a flowchart of a method for smoothing transitions of an ADC relating to a peak detection function, in accordance with aspects of the invention.

FIG. 8 is a flowchart of a method for smoothing transitions of an ADC relating to a peak detection function, according to one embodiment of the invention.

After a start block, the logical flow moves to block 802. At block 802, the multiplexer node is set by the analog/digital conversion of the analog signal. Transitioning to block 804, the method determines the logical value of the comparison between the reference signal relating to the output code and the input signal itself. Moving to block 806, the method determines whether the logical value of the comparison between the signals is high or low. When the logical value of the comparison between the reference signal and the input signal is low, the logic moves to block 808. At block 808, an attack counter is reset, and a decay counter is incremented. The logic then moves to decision block 810, where the method determines whether the decay counter has overflowed. When the decay counter has not overflowed, the logic returns to block 804. When the decay counter has overflowed, the logic moves to block 812. At block 812, the address counter is decremented, the multiplexer counter is decremented, and the decay counter is reset. The logic then moves to block 804.

When the logical value of the comparison made by the logic at decision block 806 between the reference signal and the input signal is high, the logic flows to block 814. At block 814, the decay counter is reset and the attack counter is incremented. Transitioning to decision block 816, a determination is made as to whether the attack counter has overflowed. When the attack counter has not overflowed, the logic returns to block 804. When the attack counter has overflowed, the logic moves to block 818. At block 818, the address counter is incremented, the multiplexer counter is incremented, and the attack counter is reset. The logic then returns to block 804.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method for smoothing transitions relating to a signal processing function, comprising:
   producing a continuously variable reference signal;
   making a comparison between an input signal and the reference signal;
   adjusting the reference signal in response to the comparison to implement the signal processing function;
   smoothing the reference signal; and
   producing an output signal relating to the reference signal.

2. The method of claim 1, wherein adjusting the reference signal in response to the comparison, further comprises applying an algorithm that relates to the signal processing function and smoothes transitions of the output signal.

3. The method as in claim 2, wherein adjusting the reference signal in response to the comparison, further comprises adjusting the reference signal in response to a feedback signal, wherein the feedback signal is produced by the algorithm.

4. The method as in claim 3, further comprising applying a low-pass filter to the output signal.

5. A method for smoothing transitions in an ADC for current regulation, comprising:
   converting signal to a continuously variable reference signal; and
   adjusting the reference signal to produce the peak detection signal processing function having smooth transitions, wherein the reference signal is converted to a peak detector signal.

6. The method as in claim 5, wherein adjusting the reference signal to obtain the peak detection signal processing function having smooth transitions, further comprises applying an algorithm that is used to adjust the reference signal.

7. The method as in claim 6, wherein the algorithm further comprises:
   comparing the reference signal to an input signal; and
   adjusting the reference signal in response to the comparison.

8. The method as in claim 7, wherein the algorithm has a fast attack and a slow decay.

9. The method as in claim 8, wherein the reference signal is adjusted upward when a current input level value of the input signal is above a current reference level value of the reference signal for a pre-determined first period of time.

10. The method as in claim 9, wherein the reference signal is adjusted downward when a current input level value of the input signal is below a current reference level value of the reference signal for a pre-determined second period of time.

11. The method as in claim 10, wherein the pre-determined first period of time is less than the pre-determined second period of time.

12. The method as in claim 11, wherein comparing the reference signal to the input signal, further comprises storing a previous reference level value of the reference signal and making a comparison of the stored reference level value to the input signal.

13. The method as in claim 12, wherein an attack counter is used to determine the first pre-determined period of time.

14. The method as in claim 13, wherein a decay counter is used to determine the second period of time.

15. The method as in claim 5, further comprising, filtering the signal with an anti-alias filter.

* * * * *

UNITED STATES PATENT AND TRADEMARK OFFICE
CERTIFICATE OF CORRECTION

PATENT NO.    : 6,731,230 B1
DATED         : May 4, 2004
INVENTOR(S)   : Francisco Javier Guerrero Mercado et al.

It is certified that error appears in the above-identified patent and that said Letters Patent is hereby corrected as shown below:

Title page,
Item [56], References Cited, OTHER PUBLICATIONS, "B. Ravavi…" reference, "p. 9 of NCS 'Application Note 4' from 1991 NSC Linear Applications Handbook." is a separate reference and should begin on the next line.

Column 3,
Line 12, please change "Si" to -- S1 --.

Column 10,
Line 51, please change "first pre-determined" to -- first predetermined --.

Signed and Sealed this

Thirty-first Day of August, 2004

JON W. DUDAS
*Director of the United States Patent and Trademark Office*